(12) United States Patent
Stockum

(10) Patent No.: US 8,575,918 B2
(45) Date of Patent: Nov. 5, 2013

(54) WIDEBAND TRANSDUCER FOR MEASURING A BROAD RANGE OF CURRENTS IN HIGH VOLTAGE CONDUCTORS

(76) Inventor: Frank R. Stockum, Wadsworth, OH (US)

(*) Notice: Subject to any disclaimer, the term of this patent is extended or adjusted under 35 U.S.C. 154(b) by 325 days.

(21) Appl. No.: 13/042,919

(22) Filed: Mar. 8, 2011

(65) Prior Publication Data

US 2011/0221437 A1 Sep. 15, 2011

Related U.S. Application Data

(60) Provisional application No. 61/339,980, filed on Mar. 12, 2010, provisional application No. 61/396,887, filed on Jun. 4, 2010.

(51) Int. Cl.
*G01R 15/18* (2006.01)

(52) U.S. Cl.
USPC .................. 324/127; 324/117 H; 324/126

(58) Field of Classification Search
USPC .................................................. 324/117 H
See application file for complete search history.

(56) References Cited

U.S. PATENT DOCUMENTS

| | | | | |
|---|---|---|---|---|
| 3,528,009 A | * | 9/1970 | Astrove | 324/133 |
| 4,414,543 A | * | 11/1983 | Schweitzer, Jr. | 340/651 |
| 4,454,557 A | * | 6/1984 | Hurley | 361/93.6 |
| 5,444,380 A | * | 8/1995 | Bourgeois et al. | 324/529 |
| 5,530,364 A | * | 6/1996 | Mashikian et al. | 324/529 |
| 5,734,264 A | * | 3/1998 | Berna et al. | 324/117 H |
| 6,628,495 B2 | * | 9/2003 | Gerfast | 361/115 |
| 7,265,533 B2 | * | 9/2007 | Lightbody et al. | 324/126 |
| 2006/0043960 A1 | | 3/2006 | Itoh et al. | |

* cited by examiner

*Primary Examiner* — Richard Isla Rodas
(74) *Attorney, Agent, or Firm* — Sand & Sebolt

(57) ABSTRACT

A system and method for measuring electrical current by measuring magnetic flux density is presented. A magnetic flux density measuring device for measuring a magnetic field strength generated by a current in a conductor includes a ring, a pair of metal strips with high magnetic permeability and a magnetic field sensor. The ring is generally concentric with the conductor and supports the pair of metal strips. The metal strips are located back-to-back and form a gap between the metal strips. The sensor located in the gap to measure the magnetic field strength in the gap.

17 Claims, 14 Drawing Sheets

WIDEBAND TRANSDUCER FOR MEASURING A BROAD RANGE OF CURRENTS IN HIGH VOLTAGE CONDUCTORS

CROSS REFERENCE TO RELATED APPLICATION

This application claims priority from U.S. Provisional Application Ser. No. 61/339,980, filed Mar. 12, 2010; and U.S. Provisional Application Ser. No. 61/396,887, filed Jun. 4, 2010; the disclosure of which are incorporated herein by reference.

BACKGROUND OF THE INVENTION

1. Field of Invention

The current invention relates generally to apparatus, systems and methods for monitoring electrical signals. More particularly, the apparatus, systems and methods relate to measuring an electrical current. Specifically, the apparatus, systems and methods provide for non-contact measurement an electrical current with magnetic materials.

2. Description of Related Art

Traditional current measuring devices include current transformers (CTs) that utilize a magnetic core as a component in the measuring circuit. The magnetic core shape is typically a cylindrical or rectangular prism with a central hole. The core is often constructed by stacking thin laminated magnetic grade steel forms to a prescribed height. A hole through the core perpendicular to the planes of the laminates is provided for electrical current carrying conductor(s) to pass through and thus form the primary winding of a two winding transformer. A second insulated copper conductor is wrapped through the central opening and around the core material for multiple turns thus making a secondary winding for the current transformer. An ammeter is used to measure the secondary current which is proportional to the primary current up to the point where the core is saturated with magnetic flux.

Versions of the current transformer with provisions for the core to open and to be placed around the primary current conductor(s) are known as split-core current transformers. A split-core CT that can be hand held and includes a mechanism to facilitate opening and closing of the core is known as a "clamp-on" ammeter. The movable parts of the core are called "jaws" and they made so the mating faces are flat and make intimate contact with each other when closed thus minimizing the air gap space. Since transformers in general and CTs in particular can only measure alternating current (AC), additional instrumentation is needed to measure direct current (DC) or other unidirectional currents. Magnetic transducers can be employed in split core and Clamp-on meters to add DC capability to iron core current transformers. The transducer normally used is a Hall-Effect device.

The Hall-Effect device can be configured as an integrated circuit implemented on a linear bipolar silicon chip. This version of the Hall-Effect device produces an output voltage linearly related to the amplitude and phase of a magnetic field normal to plates of a Hall device in the silicon chip. The voltage generated by the magnetic field is known as the Hall voltage.

When the magnetic flux in a core produced by a DC current in the linear region of the core iron passes through the Hall sensor, a voltage is developed that is an analog measure of the current magnitude. In clamp CTs, the Hall-Effect device is positioned on the face of one of the jaws such that the magnetic flux in the core passes perpendicularly through the silicone chip when the jaws are closed and an electrical current is flowing in the primary conductor(s). An amplifier is used to increase the Hall voltage to a level that can be read by a voltmeter. The voltmeter is calibrated with scaling factors such that the meter reading has the units of current but this is not a precise meter. In order to make accurate DC or AC measurements with Hall-Effect devices inserted in magnetic cores, magnetic flux nullification must be used to make the net flux in the core zero which is complex and expensive. In the aluminum refining industry, electrolysis currents of 400 kA can be measured to 0.1% accuracy with elaborate Hall-Effect DC current transducers. Thus, the use Hall-Effect devices in current measurements is well established but often very costly.

The magnetic iron in prior art current measuring devices is the source of errors and losses. Errors are caused by the residual magnetism, saturation of the magnetic material and non-linearity of the iron. Losses result from eddy currents induced in the core, hysteresis losses and copper loses in the secondary winding. Core and coil losses can be reduced with improved materials and efficient designs but they cannot be eliminated and there is the penalty of increased manufacturing costs. The application of iron core current transformers is primarily limited to 60 Hz symmetrical sine waves because DC components create economical and technical problems and high frequencies increase the inductance impedance to unacceptable levels.

In the field of protection of electrical power equipment such as transformers, generators, reactors, and other expensive apparatus, current transformers are one of the key components. These special purpose current transformers must provide information to the relays that determine if and when to operate the protective circuit breakers to prevent catastrophic damage to the electrical system. However, if the CT information is incomplete or inaccurate, then an unnecessary and costly false shut down may occur or worse, the fault may not be cleared. A vast amount of literature deals with the short coming of the current transformers and what has to be done to mitigate them.

The primary functional problem with the current transformer in protection systems is saturation of the iron core. Over currents can cause the core to saturate and become flat topped which is detrimental to the protective system but saturation from a DC component is a more serious problem because transformer action completely ceases and recovery is slow. During power system surges and faults, the current wave is usually asymmetrical and that is where the DC component arises.

Another issue with current transformers is the need to supply a burden because they have a current output. Therefore, current transformer secondary windings require a volt-ampere rating sufficient to meet the load demand plus the losses of the secondary leads that carry the current to that load. In some relaying applications, longer leads than are technically feasible are needed and that can cause the protection to be compromised even more.

Current transforms contribute to the fixed losses (eddy currents & hysteresis) as well as the variable losses (copper) of power systems. Reduction of these loses has become a priority in the effort to conserve resources and protect the environment.

There are additional issues with current transformers used to measure currents in conductors operating at high voltage (above 600 volts). The large physical size, weight, and power losses all lead to major compromises in the application of the iron core transformers for current measurements in high voltage current transformers (HVCT). Three designs are in use 1)

current transformers placed in a metal container at the top of an insulating housing ("live tank" or top core), 2) current transformers placed at the bottom of an insulating housing (hairpin or "dead tank") and 3) current transformer mounted part way down in the insulating housing ("eye-bolt" or cascade). In all three configurations, the designs are far from what is needed; therefore, a better current measuring device is needed.

SUMMARY OF THE INVENTION

The preferred embodiment of the invention includes a magnetic flux density measuring device for measuring a magnetic field strength generated by an electrical current flowing in a conductor. The conductor may be a high voltage conductor. The magnetic flux density measuring device includes a ring, a pair of metal strips with high magnetic permeability and a sensor. The ring is generally concentric with the conductor and supports the pair of metal strips. The metal strips are located back-to-back and form a gap between the metal strips. The sensor is located in the gap to measure the magnetic field strength in the gap.

In one configuration of the preferred embodiment, the pair of metal strips may be formed with a Nickel-Iron (Ni—Fe) alloy. In some configurations, the pair of metal strips can be formed with a Nickel-Iron (Ni—Fe) alloy of about 80 percent Nickel and be annealed to about a 16,000 gauss saturation induction level with about 1.2 amperes per meter of coercive force. In the preferred embodiment, the pair of metal strips has a relative magnetic permeability ($\mu_r$) of over 100,000. The pair of metal strips may be concentric with the conductor.

In other configurations of the preferred embodiment, the magnetic flux density measuring device includes input and output fiber optic lines. The an input fiber optic line supplies a signal to power the sensor and the output fiber optic outputs a signal from the sensor indicating the magnetic field strength measured in the gap.

Another configuration of the preferred embodiment is a system that includes first and second elongated strips and a magnetic flux density sensor for measuring a magnetic flux density generated by an electrical current in a conductor. The first and second elongated strips have high magnetic permeability and have first and second ends. A support assembly supports the first elongated strip and the second elongated strip so that the first end of the first elongated strip and the second end of the second elongated strip from an air gap between the first end of the first elongated strip and the second end of the second elongated strip. A magnetic flux density sensor is located in the air gap and positioned between the first end of the first elongated strip and the second end of the second elongated strip. The support supports the first elongated strip, the second elongated strip and the magnetic flux density sensor outward from the conductor without contacting the conductor. The first elongated strip, the second elongated strip and the magnetic flux density sensor form an arc that is concentric with the conductor. The arc is less than 45 degrees. The magnetic flux density sensor is positioned to measure magnetic flux generated by the conductor that passes from the second end of the first elongated strip to the first end of the first elongated strip, through the air gap to the second end of the second elongated strip to first end of the second elongated strip.

In some configurations of this embodiment, the first elongated strip and the second elongated strip form a curved rectangular shaped with about a one inch length and about a half inch wide by about one-sixteenth inch thick cross-section. The air gap is formed by positioning the first end of the first elongated strip about one-sixteenth of an inch from the second end of the second elongated strip. The magnetic flux density sensor can be a Hall-Effect device.

In other configurations, the system includes a grounded base and a tube connected to the grounded base. The support assembly is attached to the tube. The support assembly, first elongated strip, second elongated strip, magnetic flux density sensor and tube are all at ground potential. The system can include a toroidally shaped shield covering the support assembly. Wires carry signals from the magnetic flux density sensor through the tube to a terminal box at the grounded base.

In another configuration of this system, an alternative magnetic flux measurement system may be used. In this system, multiple turns of insulated wire with two ends wrapped around the first elongated strip can be used to obtain a voltage between the two ends that is output to either a passive or active electrical circuit for measuring the current of the conductor.

Another configuration of the preferred embodiment includes a magnetic flux density measuring device for measuring a magnetic field generated by a current in a high voltage conductor that includes an elongated porcelain insulator. The elongated porcelain insulator housing has a midpoint, a top end and a bottom end. An expansion chamber including a reservoir is located at the top end of the housing. A magnetic field measuring assembly is located in the reservoir for measuring magnetic field strength of the electrical current in the conductor. Signal wires carry an electrical signal from the magnetic field measuring assembly to a location external to the housing. A tube runs from the expansion chamber to the bottom end of the housing to shield the signal wires running inside the tube. An electrically insulated cylinder covers part of the tube. A first stress cone is embedded in a first elastomeric insulator near the midpoint of the housing to provide electric field control. A second stress cone is embedded in a second elastomeric insulator near the top end of the housing. A conducting shield is located over the electrically insulated cylinder between the first stress cone and the second stress cone to confine the electric field between the conducting shield and the tube. The system can include a copper braid connecting the reservoir with the conducting stress cones and shield to provide for the tube to be insulated while the conducting shield, first stress cone and second stress cone are at high voltage.

In a preferred embodiment of the invention, the magnetic measuring components are chosen such that abnormally high current can be measured for the purpose of opening a circuit breaker when the value representing a current crosses a threshold value.

BRIEF DESCRIPTION OF SEVERAL VIEWS OF THE DRAWINGS

One or more preferred embodiments that illustrate the best mode(s) are set forth in the drawings and in the following description. The appended claims particularly and distinctly point out and set forth the invention.

The accompanying drawings, which are incorporated in and constitute a part of the specification, illustrate various example methods, and other example embodiments of various aspects of the invention. It will be appreciated that the illustrated element boundaries (e.g., boxes, groups of boxes, or other shapes) in the figures represent one example of the boundaries. One of ordinary skill in the art will appreciate that in some examples one element may be designed as multiple elements or that multiple elements may be designed as one element. In some examples, an element shown as an internal component of another element may be implemented as an external component and vice versa. Furthermore, elements may not be drawn to scale.

Similar numbers refer to similar parts throughout the drawings.

DETAILED DESCRIPTION

Figure 1:
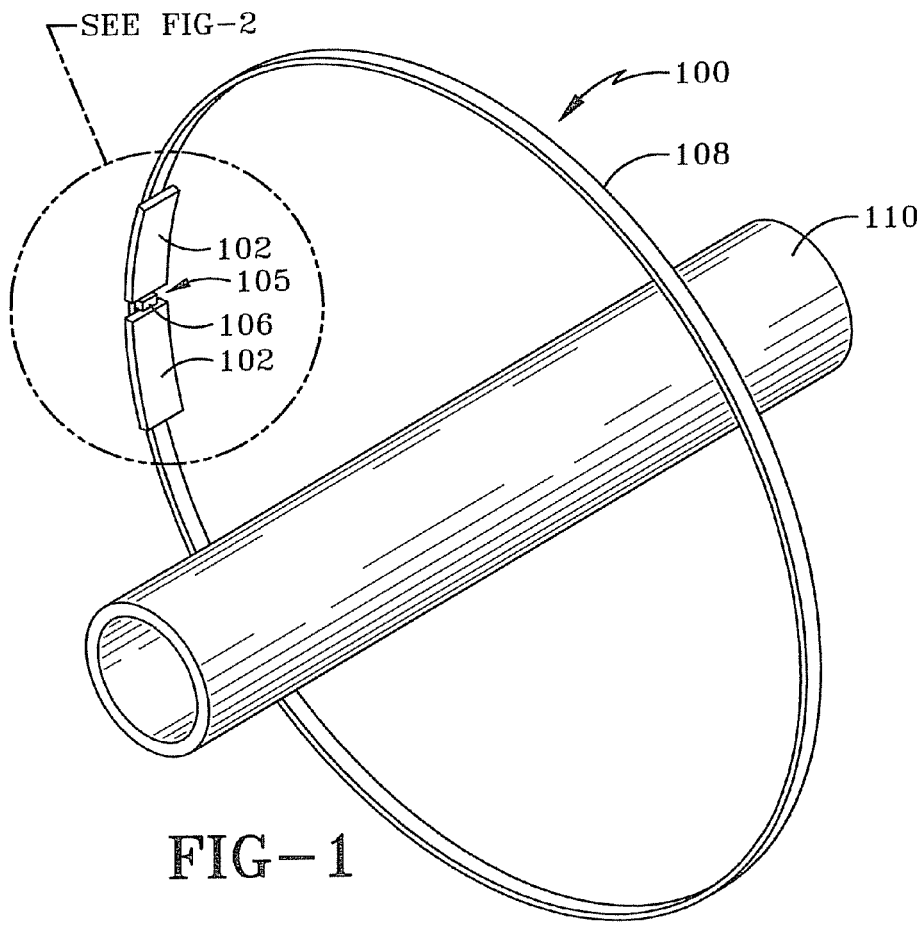
FIG. 1 illustrates a preferred embodiment of a magnetic flux density measuring device.

FIG. 1 illustrates the preferred embodiment of a magnetic flux density measuring device 100 (e.g., current transducer) for measuring a magnetic field strength generated by a current in conductor 110. In one configuration of the preferred embodiment, the conductor 110 is generally a high voltage conductor with a voltage greater than 100 volts and more typically more than 10,000 volts. The magnetic flux density measuring device 100 would typically be used to measure currents in high voltage conductors in substations for metering and to detect power surges (lightning strikes) and other events on a power line. When the magnetic flux density measuring device 100 detects a power surge, electronically operated circuit breakers could be opened to protect the power grid from extensive/catastrophic damage.

Figure 2:
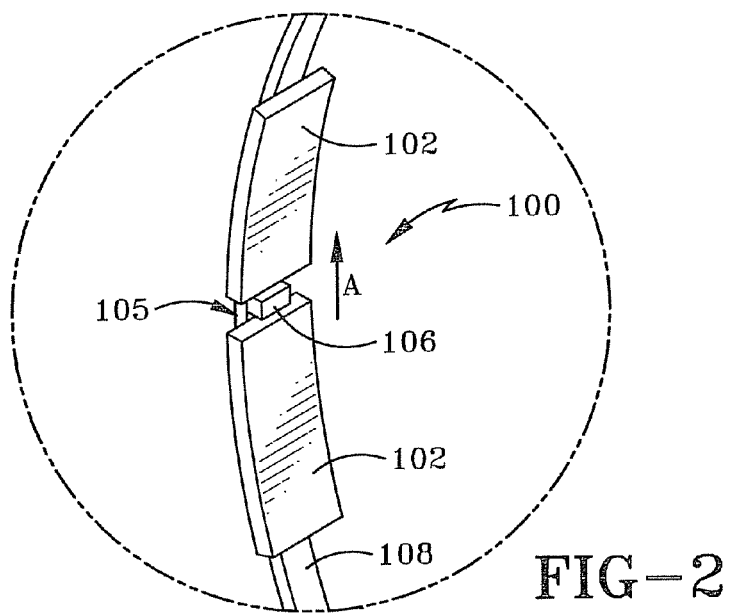
FIG. 2 illustrates a detailed view of a pair of metal strips forming a gap of the preferred embodiment of the magnetic flux density measuring device.

The device 100 includes a ring 108 that is generally concentric with the conductor 110. A pair of metal strips 102 with high magnetic permeability supported by the ring 108. As best seen in FIG. 2, the metal strips 102 are located back-to-back and form a gap 105 between the metal strips 102. A sensor 106 is located in the gap to measure the magnetic field strength in the gap 105. As discussed below, the sensor 106 can be a Hall-Effect type of sensor.

In the preferred embodiment, the metal strips 102 are relatively short and narrow strips of metal bonded to a copper cylinder 108 that is concentric with the current carrying conductor 110. The magnetic strips 102 have exceptionally high magnetic permeability which results in much larger magnetic flux density (B field) in the gap than in the adjacent non-magnetic copper and air. The magnetic material used in the preferred embodiment is a Nickel-Iron (Ni—Fe) alloy having sufficient Ni content to produce very high permeability. Approximately 80% Ni is used to get a high permeability. The alloy is annealed to achieve the desired magnetic properties such as high permeability, low losses, linearity, minimal retentivity and low coercivity. The material can be annealed in an H2 atmosphere in the temperature range 1100-1180° C. The metal strips 102 typically have about 8000 gauss saturation induction, 1.2 amps/meter coercive force and maximum relative permeability of 300,000. Other Fe—Ni alloys with less than 80% Ni that have lower maximum permeability and higher saturations levels can be used to measure fault currents, inrush currents, and other transient currents that could saturate the very high permeability alloys.

In one configuration of the preferred embodiment, the strips of Fe—Ni alloy are soldered or otherwise bonded to the copper band 108 or another suitable support material having high electrical conductivity so that the individual segments 102 are separated by short gaps 105 of controlled length. The copper band 108 provides two additional benefits: (1) the magnetic field is more constant across the width of the gap 105 than it would be if the metal cylinder 108 were not present and (2) eddy currents in the copper effectively block external magnetic fields that could otherwise introduce errors in the measurements.

The strips 102 are positioned in proximity to the primary current carrying conductor 110 so that the magnetic flux from the central conductor 110 passes longitudinally through them and perpendicular to the faces of the gaps as shown by arrow A in FIG. 2. This allows the flux densities to be sufficiently high and constant to allow the sensor 106 to make accurate measurements but not high enough to cause saturation of the magnetic material 102 over the full range of specified currents. The arc of the circle subtended by the Fe—Ni strips must be substantially less than 360° to realize the benefits of the preferred embodiment and to avoid magnetic saturation that would severely limit the current range. The magnetic flux density in the strips 102 and in the air gaps 105 between strips is proportional to the inducing current and it is a virtually perfect analog representation of the inducing current. The magnetic field transducer 106 placed in the air gap 105 can very accurately measure the magnetic flux density in the gap because it is has been increased by an order of magnitude or more by the field magnifying effect of the Fe—Ni strips 102. The quantity and dimensions of the strips 102 with associated transducer 106 can vary from one to a number sufficiently large to make measurements over the specified range of currents with the required accuracy. As is understood by those of ordinary skill in the art, other transducers besides Hall-Effect devices may be used to measure the flux density, total flux, or rate of change of flux in the Fe—Ni strips 102 in cases where that is desired or when a passive measuring system is required.

In another configuration of the preferred embodiment, a passive magnetic field transducer with almost unlimited range is created when a coil of wire is wrapped around one of the strips of Fe—Ni metal. This generates a voltage between the two ends of the coiled wire proportional to the first derivative of the flux ($\phi$) produced by the current in the central conductor 110. This is similar to but not the same as a Rogowski coil that is based on Faraday's law rather than Ampere's Law. An electrical integrator circuit is can be used to convert this signal into an output that is proportional to the value of the primary current.

Simulation studies are a useful design technique for things such as determining the strip lengths or in other configurations of the preferred embodiment (discussed below) with an optimum number of pairs of strips 102 placed around the primary conductor. A 2D and rotationally symmetric 3D simulation program called the Finite Element Method Magnetics (FEMM) written by Dr. David Meeker is satisfactory for most studies to determine the sizing and placement of the strips 102; however, a 3D simulation is required for complex geometries.

Instrumentation with proper scale factors such as digital voltmeters, oscilloscopes, and microprocessor devices such as used in solid state relays can convert the analog voltage output of the sensor 106 into numerical and graphical data about the current. The peak and/or rms magnitude of the current in amperes is often sufficient; however, the output from the sensor 106 can be used to obtain other quantities including frequency, waveform, harmonic content and other parameters as understood by those of ordinary skill in the art.

The preferred embodiment of a magnetic flux density measuring device 100 provides for the accurate analog measurements of direct current (DC) as well as alternating currents up to 30 kHz with Hall-Effect devices and even higher frequencies with other magnetic transducers. All current waveforms including asymmetrical and DC can be captured. Long lead lengths of wires connected to the sensor 106 are not a problem because the signal output is an analog voltage instead of the current output of traditional current transformers. Significant reduction in operating costs is obtained because power losses are insignificant.

Figure 3:
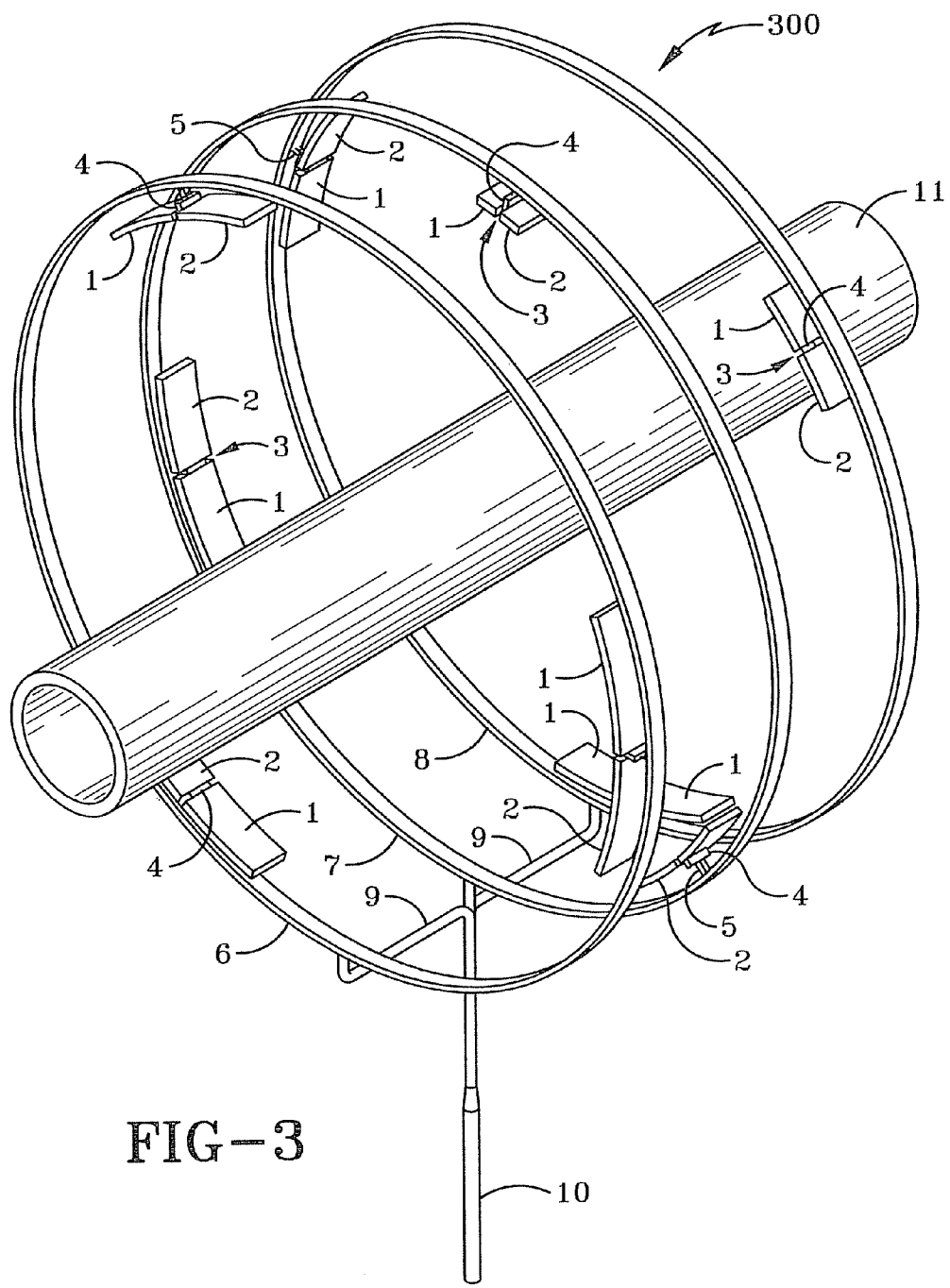
FIG. 3 illustrates a perspective view of a configuration of the preferred embodiment of a magnetic flux density measuring device.

FIG. 3 illustrates a configuration of the preferred embodiment that has multiple pairs of metal strips 102 of FIGS. 1-2 to measure magnetic flux at multiple locations and multiple current ranges. This transducer employees nine sets of metal strips 1, 2 that may be strips positioned to form air gaps 3 between them in which a sensor 4 is place for measuring magnetic flux density. The sensors 4 may be a three pin SIP (single inline pins) linear Hall-Effect devices 4. Referring further to FIG. 3, wire ways 6, 7, and 8 shown combined with copper rings 108 for convenience are located concentric with and at a larger diameter than the than air gaps 3 for the purpose of carrying wires that connect Hall-Effect device pins 5 out to a connecting wire way 9 and on to output signal cable 10. A primary conductor 11 that is carrying the current creating the magnetic flux passes concentrically through the geometric center of the sets of Fe—Ni strips 1 and 2 in a transverse direction. This concentric arrangement of pairs of strips 1 and 2 assures that the magnetic field of conductor 11 passes longitudinally through the pairs of Fe—Ni strips 1 and 2 and thus through air gaps 3 in a direction that allows accurate measurement of the magnetic flux densities in air gaps 3 by sensors 4.

Figure 4:
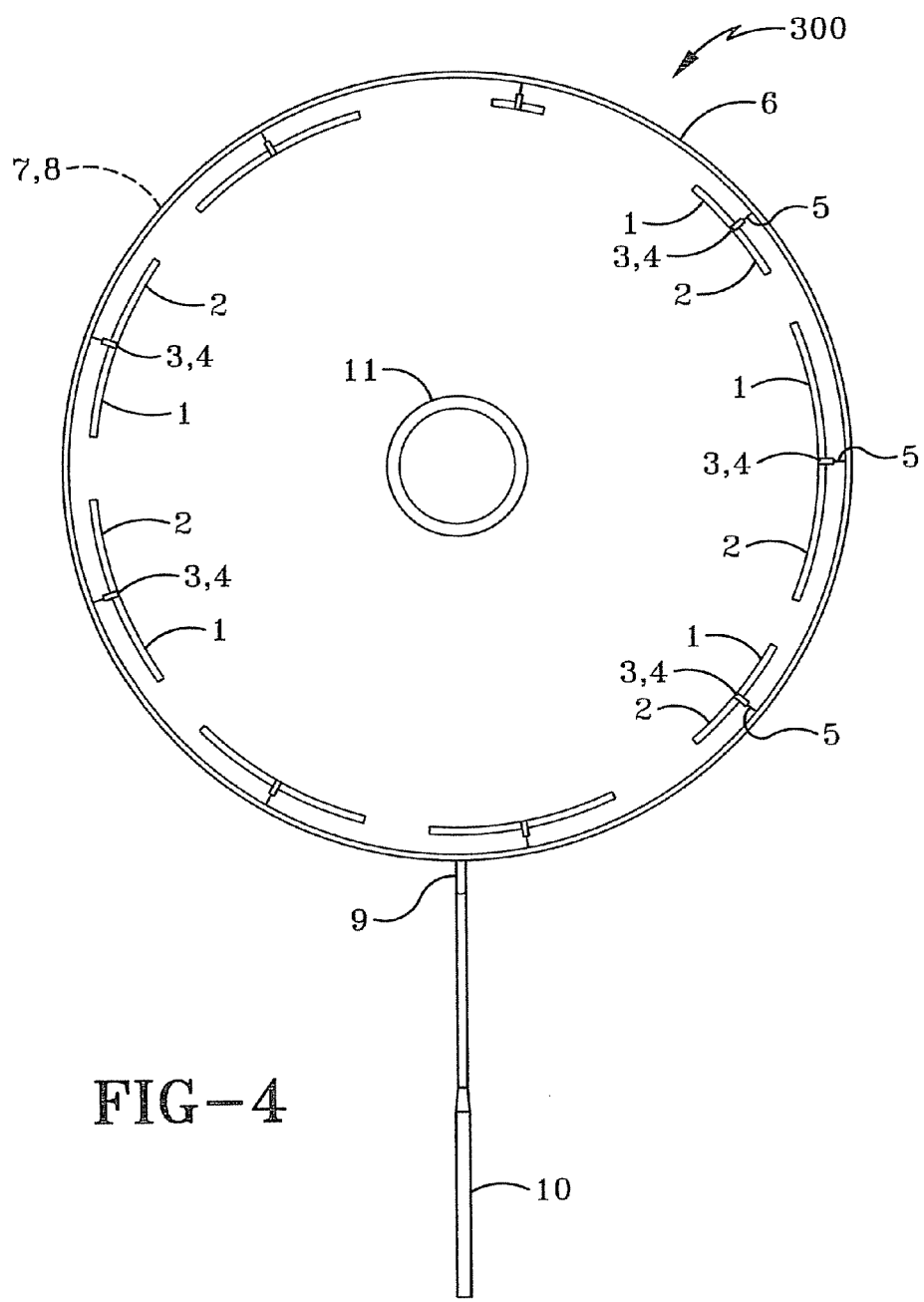
FIG. 4 illustrates a front view of a configuration of the preferred embodiment of a magnetic flux density measuring device.

FIG. 4 illustrates a front view of the configuration of the preferred embodiment that was illustrated in FIG. 3 that has multiple pairs of metal strips 102. All nine of the Fe—Ni strips 1 & 2 are shown in edge view. Corresponding sensors 4 and pin connectors 5 are in radial directions in FIG. 4. Conductor 11 is centered in the array of Fe—Ni strips 1 & 2. Output cable 10 is located at the bottom of the assembly in FIG. 4.

Figure 5:
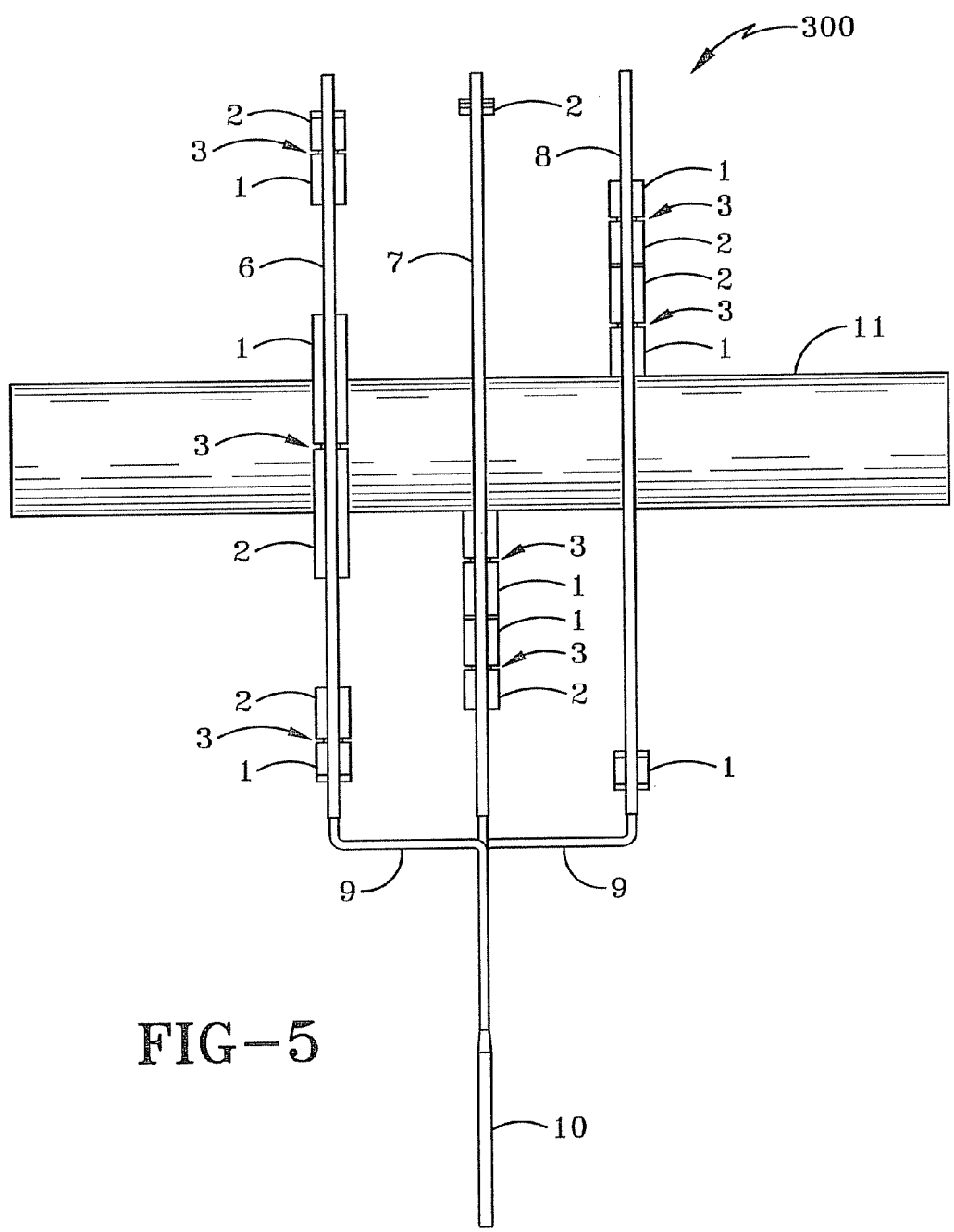
FIG. 5 illustrates a side view of a configuration of the preferred embodiment of a magnetic flux density measuring device.

FIG. 5 illustrates a side view of the configuration of the preferred embodiment that was illustrated in FIG. 3 that has multiple pairs of metal strips 102. The faces of the Fe—Ni strips 1 and 2 are seen from either the front or back. Connecting wire way 9 is shown in a horizontal position in FIG. 5. Conductor 11 passes through the measuring structure and protrudes on either side.

Figure 6:
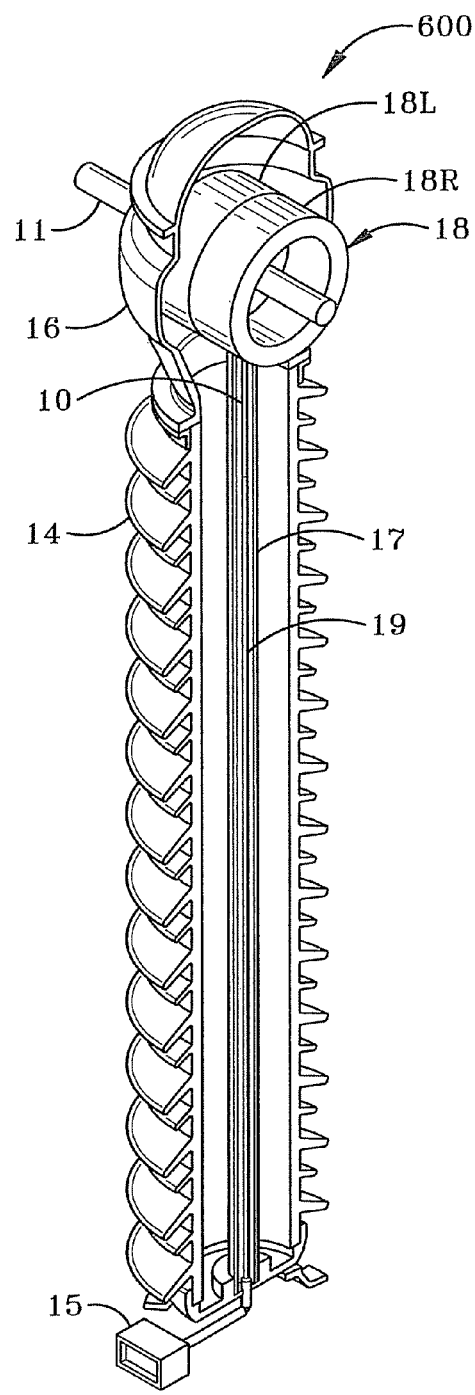
FIG. 6 is a half section view of an outdoor high voltage configuration of the preferred embodiment of a magnetic flux density measuring device.

FIG. 6 illustrates a cross-sectional view of the configuration of a preferred embodiment with multiple metal strip pairs 1 and 2 mounted in an on an outdoor high voltage current transducer 600. This figure illustrates a transducer that improves over traditional transducers in several ways. The major components of the transducer 600 are a porcelain housing 14, reservoir 16, electrostatic shield assembly 18, metal conduit 17 through which low voltage signal leads 19 pass to reach a terminal box 15. The transducer assembly of FIGS. 3-5 sits in a reservoir 16 that is enclosed in an electrostatic shield 18. In the illustrated configuration shown in FIG. 6, the insulating medium inside of the housing 14 is pressurized sulfur hexafluoride 6 (SF6) gas, however, as understood by one of ordinary skill in the art, other insulating materials may be used including oil, oil-paper and solid dielectrics. The signal wire cable 19 is connected to cable 10 (shown earlier in FIGS. 3-5) near the upper end of tube 17. Cable 19 passes down through tube 17 and then into terminal box 15 where connections to instruments at ground potential can be made.

Figure 7:
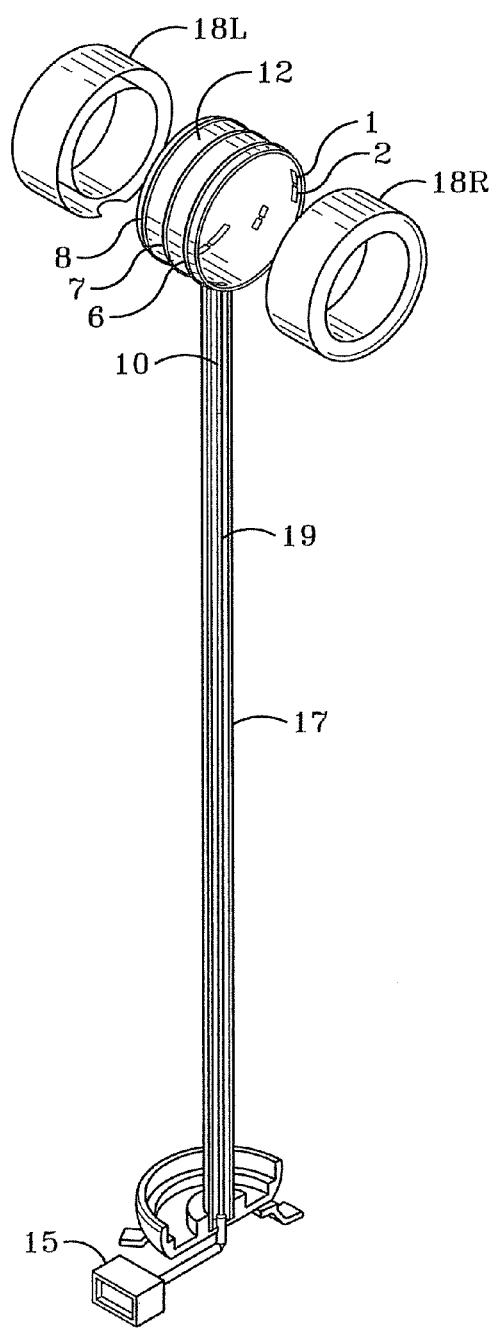
FIG. 7 is a partial exploded view of the outdoor high voltage configuration of the preferred embodiment of a magnetic flux density measuring device.

An exploded view of the components of the shielded measuring system of FIG. 6 is illustrated in FIG. 7. A copper cylinder 12 supports the three wire ways 6, 7 and 8 with multiple sets of Fe—Ni strips 1 & 2. As previously mentioned, these are components of the current transducer assembly that provides the signals to cable 10. Electrostatic shield 18, is comprised of left side 18L and right side 18R, and it limits partial discharges (PD) to specified levels at rated voltage and is configured to prevent electrical breakdown (flashovers) during dielectric tests and temporary over voltages.

Figure 8:
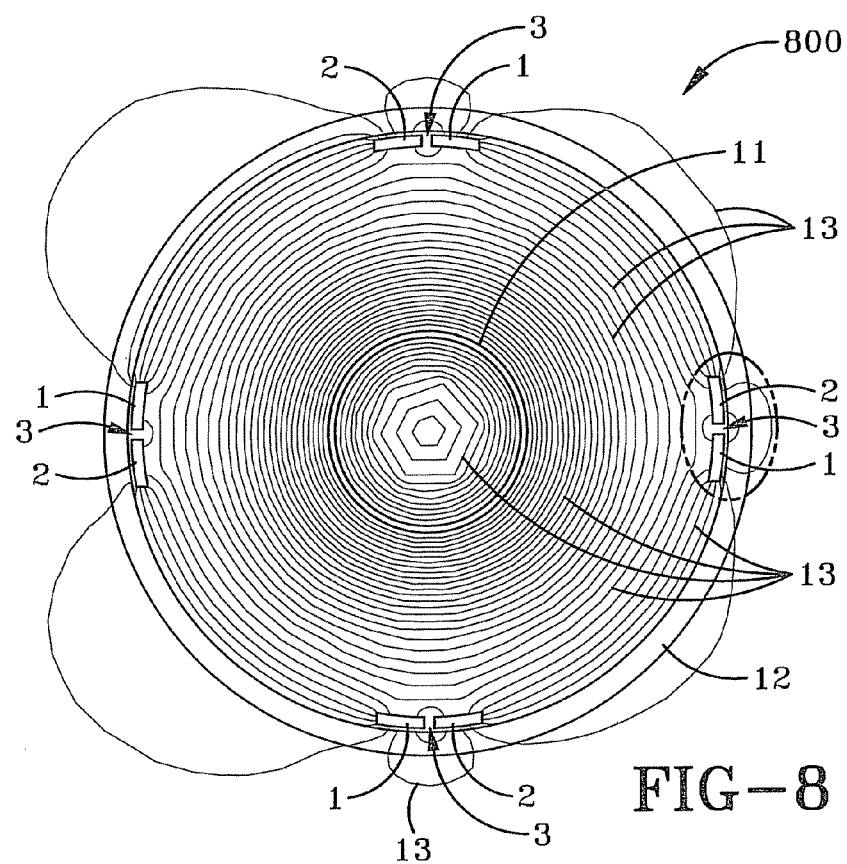
FIG. 8 is a 2D flux plot of a configuration of the preferred embodiment of a magnetic flux density measuring device.

FIG. 8 illustrates a plot of flux patterns 800 from a finite element method model (FEMM) of a configuration of the preferred embodiment of an electrical current transducer that uses four sets of Fe—Ni strips 1 & 2. This FEMM study represents a two dimensional (2D) simulation using a planar geometrical arrangement of the Fe—Ni strips 1 & 2 and copper cylinder 12 of this configuration of the preferred embodiment. As shown FIG. 8, magnetic flux lines 13 form complete paths around conductor 11 that are essentially circular out to the pairs of Fe—Ni strips 1 and 2 where the flux line pattern is altered by the high permeability Fe—Ni strips 1 and 2. This results in a much higher magnetic flux density (B) in the Fe—Ni material strips 1, 2 and gaps 3 than in the surrounding materials. The amplification of the magnetic flux density (B) is controllable by the length, width and thickness of the Fe—Ni strips 1 and 2 at any given radial distance from the centerline of conductor 11.

Figure 9:
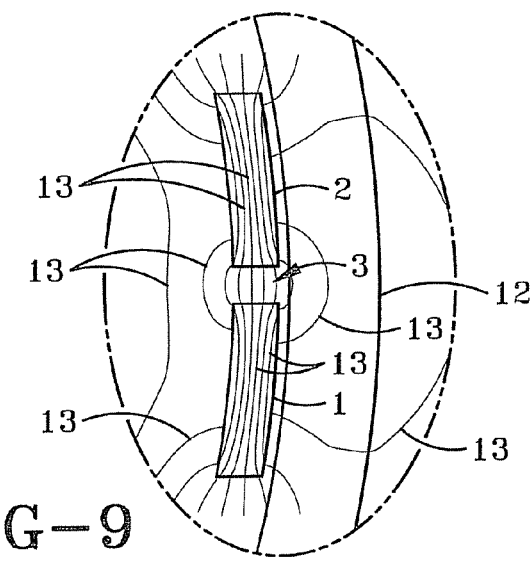
FIG. 9 is an enlarged view of a portion of the flux plot of a configuration of the preferred embodiment of a magnetic flux density measuring device.

FIG. 9 illustrates an enlarged view of the flux line pattern at the air gap 3 and metallic strips 1 and 2 as shown in the simulation results of FIG. 8. The flux lines in the Fe—Ni strips 1 and 2 enter air in the gap 3 nearly perpendicular to the end faces of the strips 1 and 2 and produce a high and uniform flux density in the air gap 3.

Figure 10:
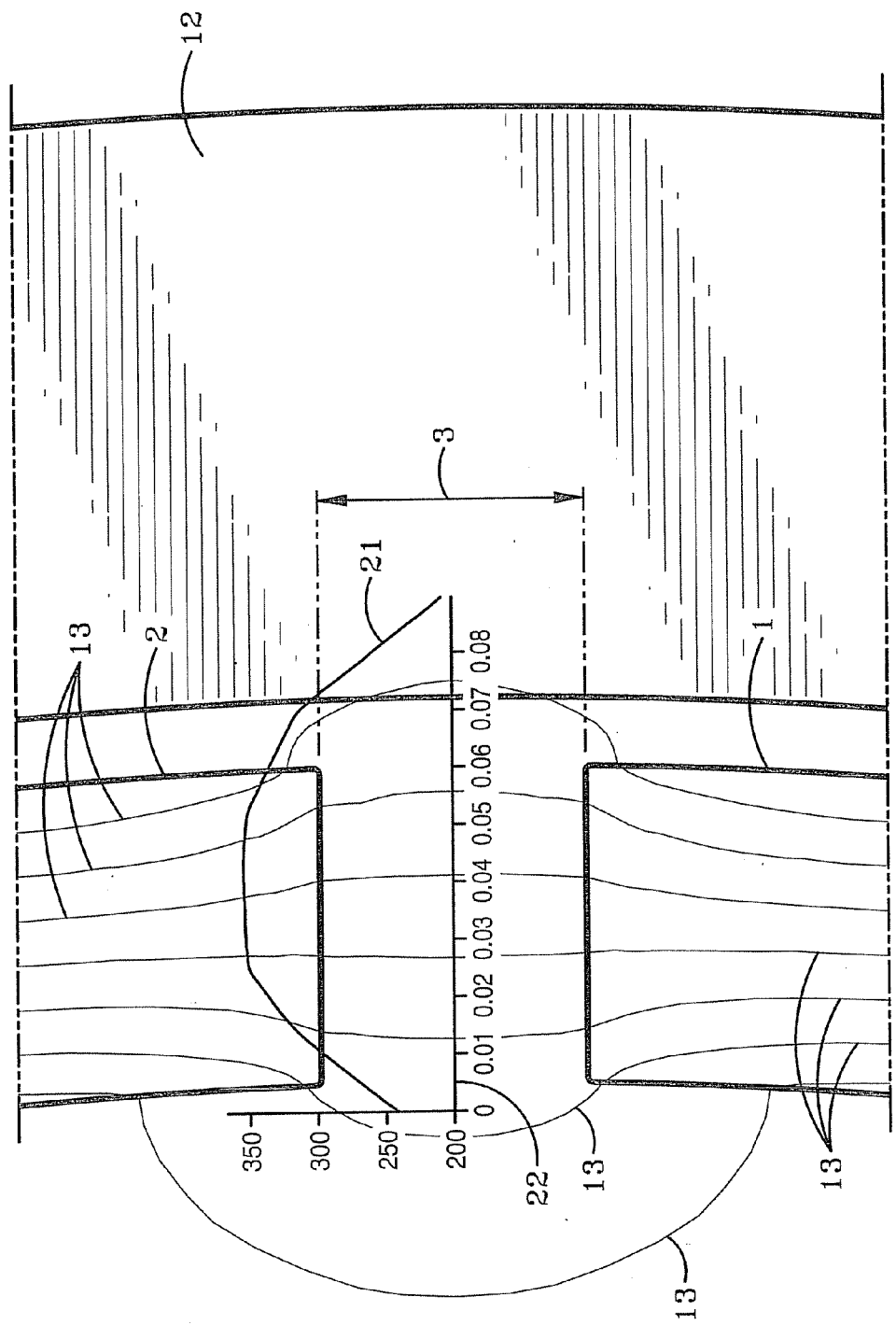
FIG. 10 is a graph of the flux density in an air gap of a configuration of the preferred embodiment of a magnetic flux density measuring device.

FIG. 10 illustrates a plot 21 of the magnitude of the flux density (|B|) across the width of the air space 3 and midway between a pair of Fe—Ni strips 1 and 2 for one value of conductor 11 current. The graph is superimposed over a background of the air gap 3 between two Fe—Ni strips 1 and 2. An abscissa axis 22 is positioned in the center of air gap 3 and is coincident with the contour line where the normal flux density measurements were taken for plot 21. The graph shows a maximum flux density magnitude of about 350 Gauss (G) that is constant over approximately 60% of the width of air space 3.

Figure 11:
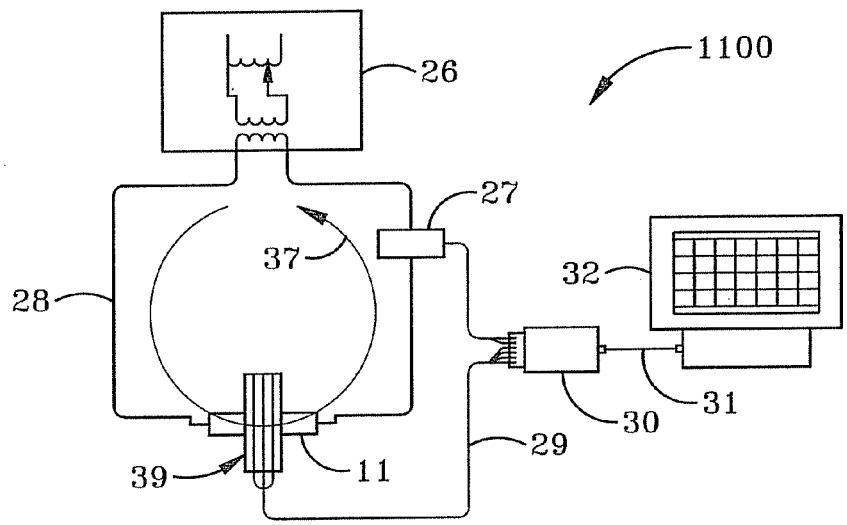
FIG. 11 is a test circuit diagram of a test circuit for testing a configuration of the preferred embodiment of a magnetic flux density measuring device.

FIG. 11 illustrates an example test circuit 1100 that can be used to determine the relationship between the current in conductor 11 and the normal flux density magnitude |B| measured by the Hall-Effect Devices 4. The transducer 39 is of similar design to the transducer modeled in the FEMM model of FIGS. 8-10 so that the simulation results can be compared directly to the test results. In the test circuit 1100, a step down transformer 26 provides adjustable current 37 to current loop 28 that flows through conductor 11 centered in a transducer unit 39. The analog voltage signal from transducer unit 39 is carried by a cable 29 to an ND converter 30 that is connected to a personal computer 32 by cable 31. The computer 32 has custom software that captures, graphs, and stores the digitized signal voltage and conductor current data. The output voltage signals from transducer unit 29 are converted to flux density by the sensitivity factor in units of gauss/mV that is provided by the Hall-Effect transducer manufacturer.

Figure 12:
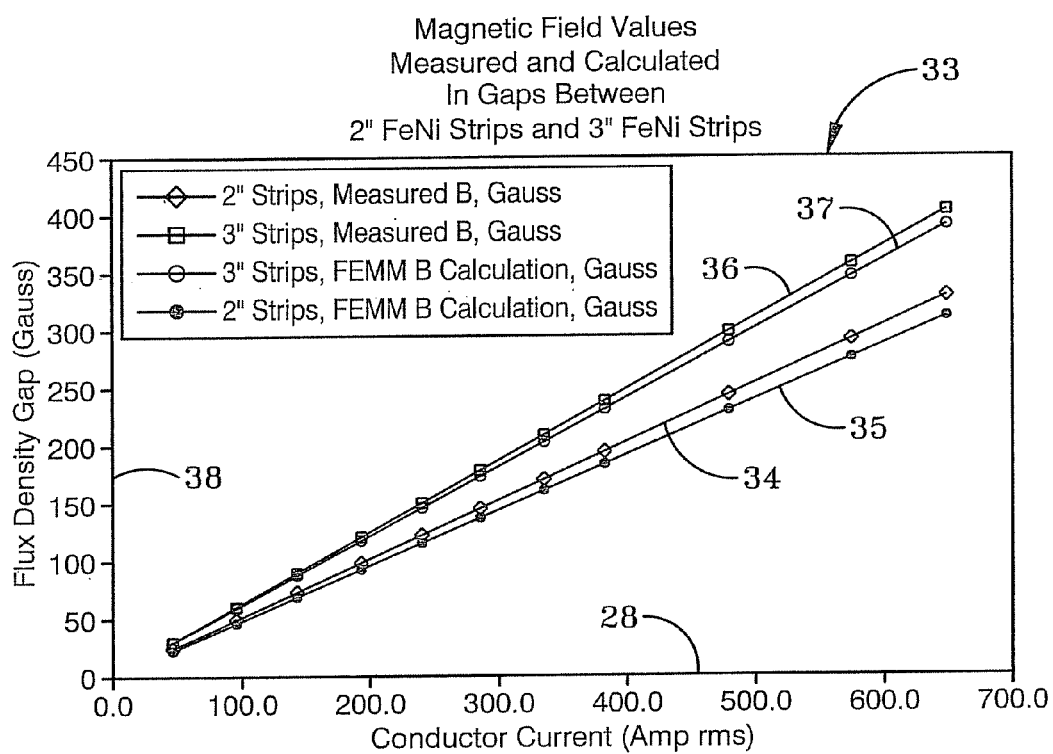
FIG. 12 is a graph of flux density vs. primary current of a magnetic flux density measuring device that compares 2D simulation results with empirical data.

FIG. 12 illustrates an example graph 33 where flux density 38 is plotted as a function of the current 37 flowing in primary conductor 11. Data points determined experimentally for 2" long Fe—Ni strips are plotted with diamonds (◇) that are connected by line 34 and points determined by FEMM simulations for 2" long strips are plotted with filled circles (-•-) that are connected by line 35. Data points determined experimentally for 3" long Fe—Ni strips are plotted with squares (□) that are connected by line 36 and points determined by FEMM simulations for 3" long Fe—Ni strips are plotted with open circles (-○-) that are connected by line 37. The correlation coefficient squared for all four data sets is 1 ($r^2=1$), thus linearity is excellent and the good agreement between simulation and experimental results shows 2D simulation is a viable design tool.

Figure 13:
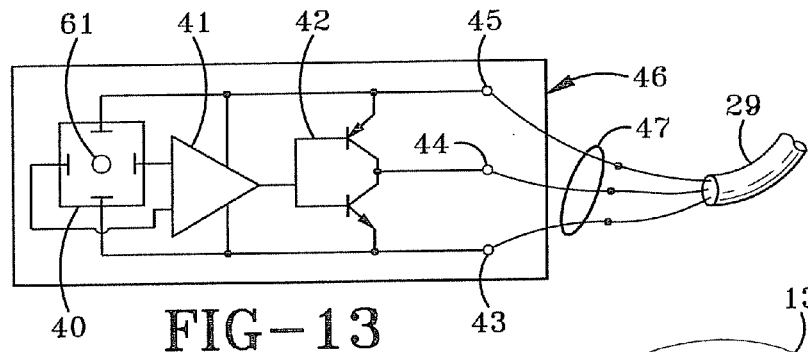
FIG. 13 is an example block diagram of a Hall-Effect device of a configuration of the preferred embodiment of a magnetic flux density measuring device.

FIG. 13 illustrates an example block diagram 46 of an example Hall-Effect transducer 4. The transducer 4 includes a Hall sensor 40 with target area 61 where the normal flux density signal B is sensed and converted to an analog voltage signal, a signal amplifier 41, a push pull output circuit 42, a ground bus 43, a signal bus 44 and a supply voltage bus 45. All of the components can be mounted on a single silicone chip or they can be individual components that are standalone or part of other devices such as microprocessor based protective relays. Lead wires 47 connect the positive voltage supply lead to terminal 45, the output signal wire to terminal 44 and the ground reference wire to terminal 43.

Figure 14:
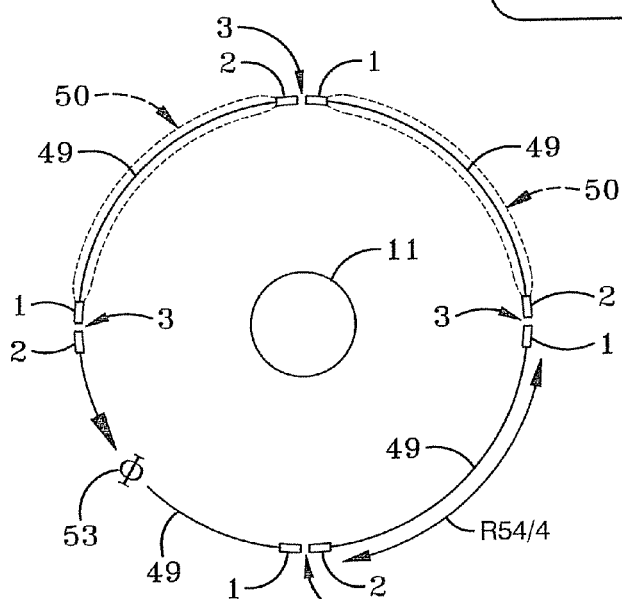
FIG. 14 is a diagram of a magnetic circuit of a configuration of the preferred embodiment of a magnetic flux density measuring device.

FIG. 14 illustrates a circular path 49 concentric with the centerline of the conductor 11 at a diameter where it passes through four sets of Fe—NI strips 1 and 2, four short air gaps 3, and four long air spaces between opposite sets of strips 1 and 2. Path 49 forms a closed loop around conductor 11 that carries electrical current I. Ampere's circuit law states that the sum of magnetomotive forces (MMFs) around a current carrying conductor is equal to the current I enclosed. Mathematically this is expressed as: Σmmfs=I. An imaginary sheath or tube 50 with varying cross sectional area A that encloses an arbitrary fixed amount of magnetic flux φ 53 is used to explain this configuration of the preferred embodiment in more detail. Along path 49, constant flux φ 53 in tube 50 passes through high permeability Fe—Ni metal and low permeability air so the cross-sectional area A of tube 50 will vary inversely with B according to the scalar formula A=φ/B. The area A of flux tube 50 will have the minimum value in the Fe—Ni strips 1 and 2, that have extremely high magnetic permeability, and the maximum area will occur in the long air spaces in between pairs of Fe—Ni strips 1 and 2 that have a relative magnetic permeability of 1. An intermediate value of A will be in air gaps 3 as a result of the boundary conditions that cause the flux lines φ to be normal to the faces of gap 3 and significantly increases the flux density in air gap 3.

Figure 15:
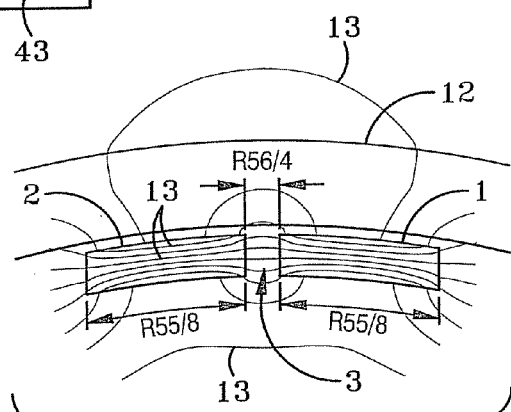
FIG. 15 is an enlarged view of an air gap in the magnetic circuit of a configuration of the preferred embodiment of a magnetic flux density measuring device.

Without loss of generality, the area of flux tube 50 in the center of air gap 3 can be selected to match the area A14 of the target 61 of the Hall-Effect devices 4 by appropriate selection of the value for constant flux φ 53. Because of the symmetry, the reluctance (analogous to resistance in electrical circuits) around the complete path 49 can be separated into three sections. The relatively long air gap sections of flux tube 50 between Fe—Ni strips 1 and 2 of FIG. 14 each have an assigned magnetic reluctance value of $\mathcal{R}$ 4/4. FIG. 15 illustrates an enlarged view of a pair of metal strips of FIG. 14. In this figure $\mathcal{R}$ 5/8 is the assigned reluctance in each section of flux tube 50 that is in Fe—Ni strips 1 and 2 and $\mathcal{R}$ 6/4 is the reluctance assigned to each section of flux tube 50 in the four short air gaps 3.

Figure 16:
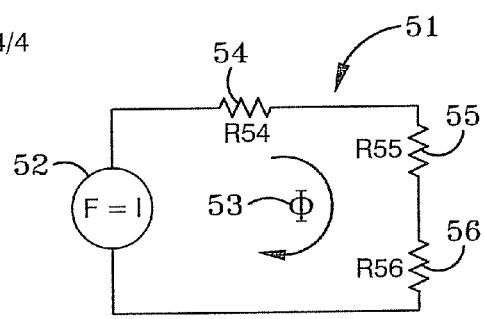
FIG. 16 is an electrical analog circuit representation of a magnetic circuit of a configuration of the preferred embodiment of a magnetic flux density measuring device.

FIG. 16 illustrates a circuit diagram 51 of the system modeled in FIGS. 14 and 15 that is a magnetic analog of a series electrical circuit. The "signal" source 52 is the current I (rms, peak, dc or other) that flows in primary conductor 11; the "current" in circuit 51 is the magnetic flux φ 53 that flows in the imaginary tube along path 49; and the "resistances" in circuit 51 are the reluctances $\mathcal{R}$ 4, $\mathcal{R}$ 5, and $\mathcal{R}$ 6 shown in FIGS. 14 and 15.

Equation 1 is obtained by writing the loop equation for circuit 51 shown in FIG. 16:

$$F = I = \phi \times \mathcal{R}4 + \phi \times \mathcal{R}5 + \phi \times \mathcal{R}6 \quad \text{(Equation 1)}$$

Solving Equation 1 for flux 53 produces:

$$\Phi = \frac{I}{R54 + R55 + R56} \quad \text{(Equation 2)}$$

equation 2 that shows that the flux flowing in the tube 50 along path 49 is conductor 11 current I divided by the sum of the reluctances around the path. Equation 3 shows that flux density B14 is the ratio of the flux 53 divided by the cross-sectional area A14 of Hall-Effect device target 61.

$$B14 = \frac{\Phi}{A14} = \frac{\frac{I}{R54 + R55 + R56}}{A14} \quad \text{(Equation 3)}$$

Therefore, the flux density B14 measured by the Hall-Effect devices 4 is a linear function of conductor 11 current I. Thus, as long as the magnetic field concentrating strips 1 and 2 are in a path 49 encircling the conductor 11 carrying the current to be measured, the magnetic fields in the strips and in the air gaps between them are proportional to current I.

Figure 17:
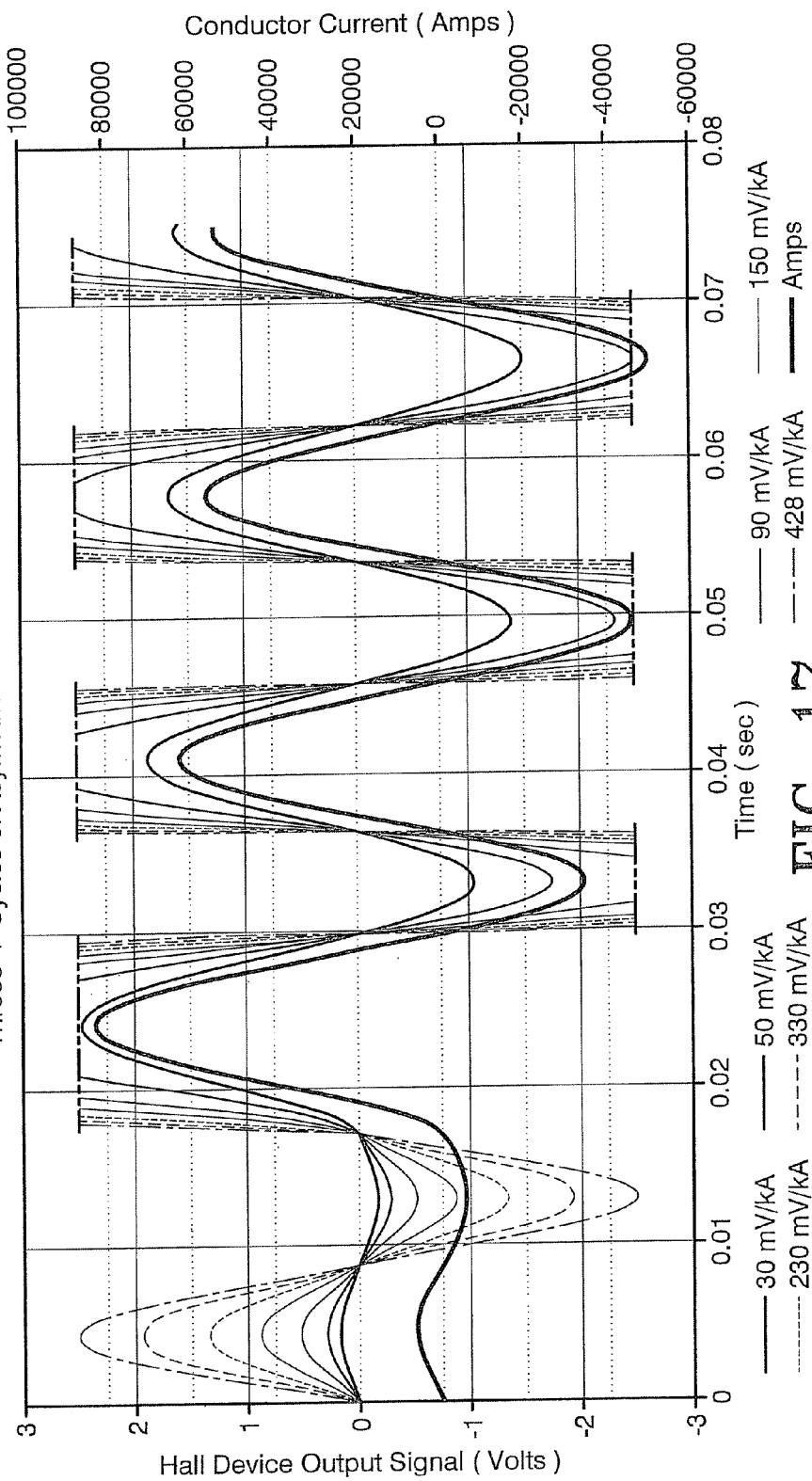
FIG. 17 is a graph showing results of a 3D simulation study of a configuration of the preferred embodiment of a magnetic flux density measuring device.

FIG. 17 illustrates a graphical output of a 3D FEM simulation of the current transducer configuration 300 of the preferred embodiment shown in FIG. 3 with seven signal outputs along with the conductor current. This output was generated by a 3D finite elements software package. The heavy line (-) curve is the current in conductor 11 that is symmetrical with a peak value of 5.8 kA before a bolted fault at 16.67 ms (one cycle of 60 Hz current) and asymmetrical with a magnitude of 82 kA at the first peak after a fault. This figure shows that each of the seven voltage output curves has a different sensitivity (mV/kA) because different magnetic field multiplication factors are associated with the seven sets of Fe—Ni strips 1 & 2. As a result, a very large range of currents can be measured. The most sensitive transducer (428-mV/kA) can accurately measure 100 A currents while the least sensitivity (30-mV/kA) can measure fault currents of more than 80 kA as indicated in FIG. 17. This wide current range capability in a single transducer fills a need by protective relays that is completely lacking in available current transformers.

Figure 18:
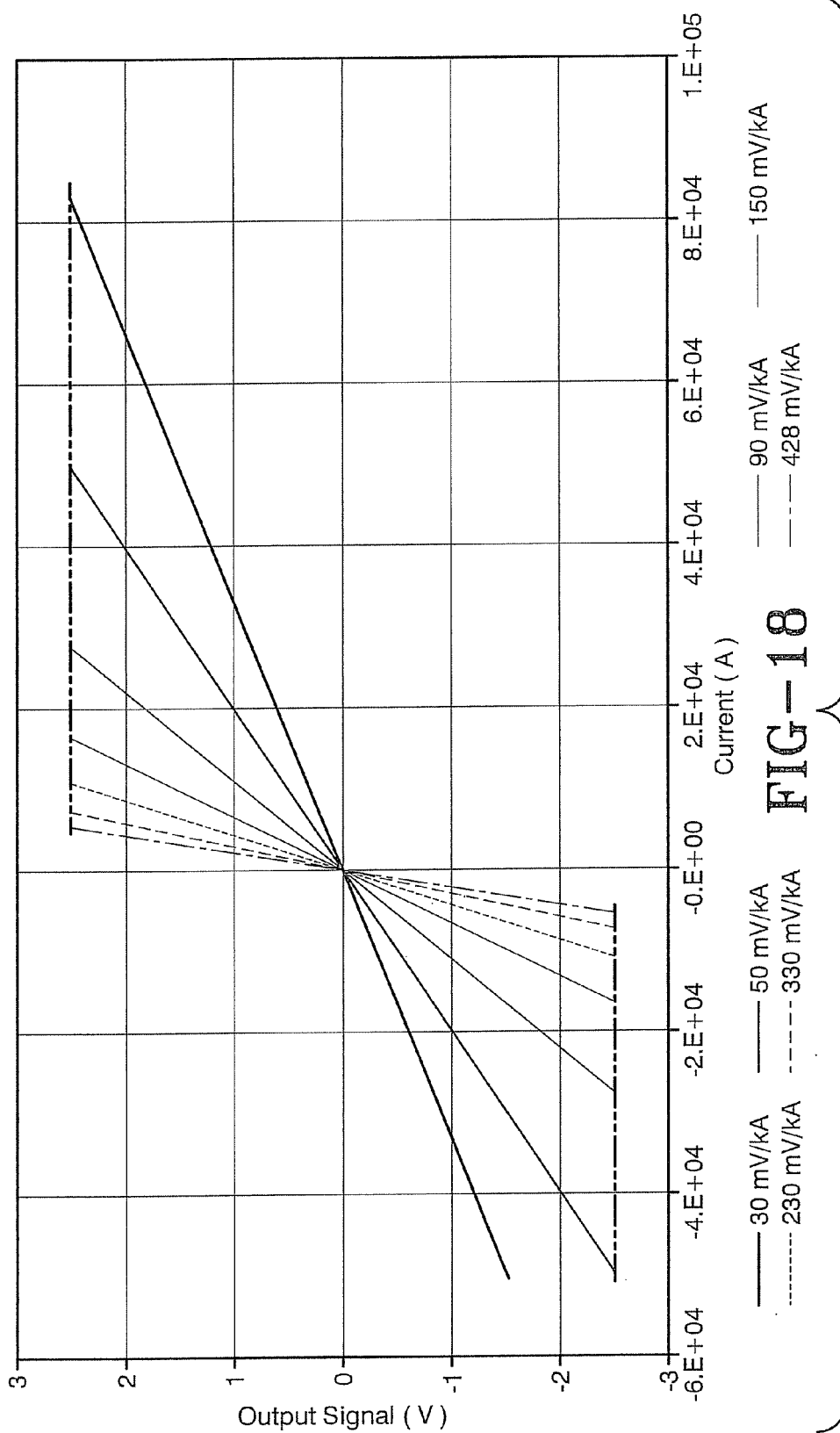
FIG. 18 is a graph of output voltage versus current from the 3D simulation of FIG. 17 demonstrating the linearity for seven sensitivities of the current transducer of a configuration of the preferred embodiment of a magnetic flux density measuring device.

FIG. 18 illustrates linearity of the output voltage over the range of currents in FIG. 17. In FIG. 18, the sensitivities are the slopes of the curves; thus, the least sensitive (30-mV/kA) can measure the highest current and vice-versa. Clipping of the signals occurs when the output signal of the Hall-Effect devices reaches the supply voltage which in this case is ±2.5 volts.

Figure 19:
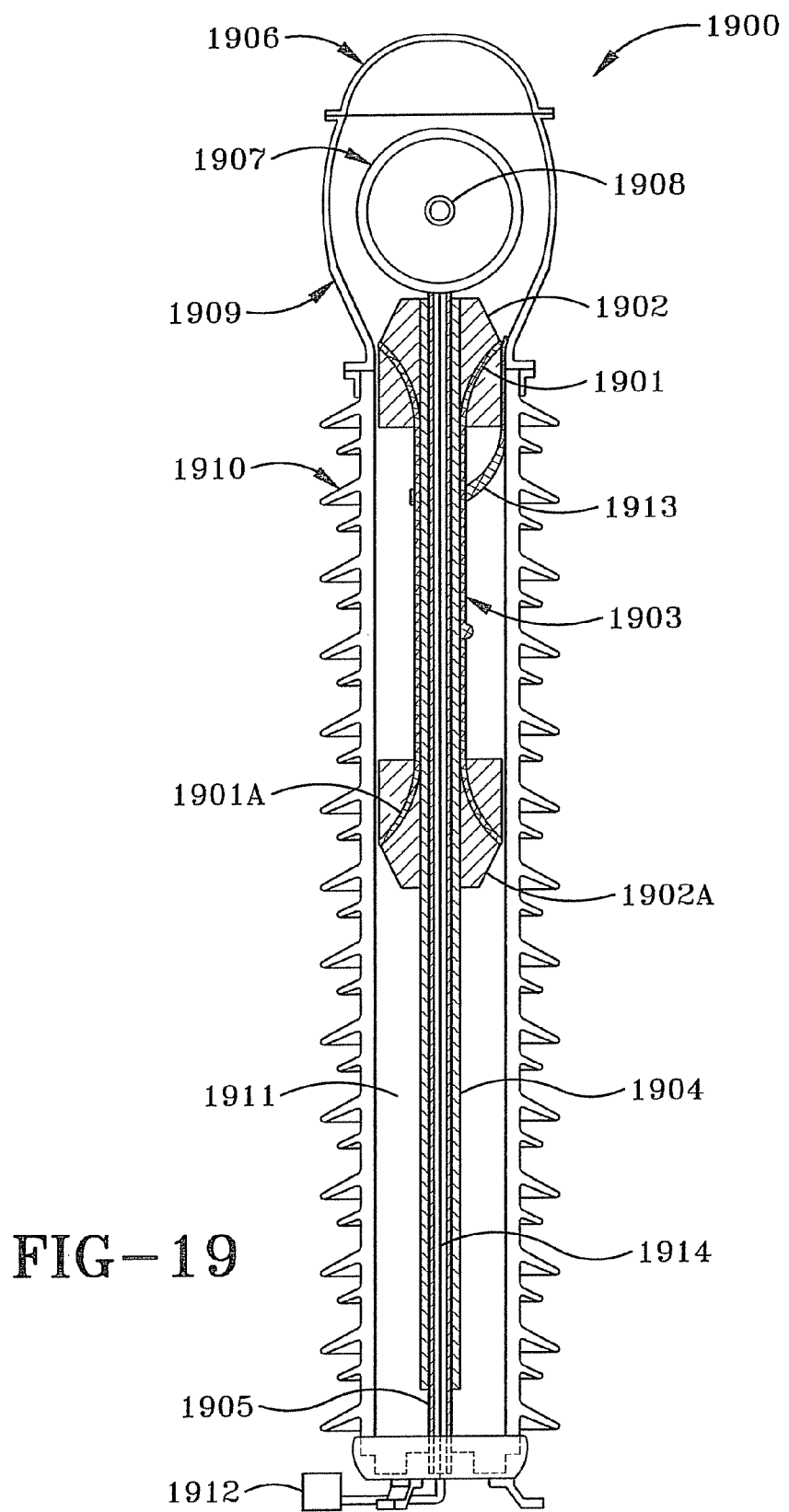
FIG. 19 illustrates a cross-sectional view of the high voltage transducer assembly of a configuration of a preferred embodiment of a magnetic flux density measuring device constructed to measure current in a high voltage conductor.

FIG. 19 illustrates another configuration of the preferred embodiment showing a high voltage transducer assembly 1900 with the insulation components and stress control components similar to those used in high voltage cable terminations. A stress cone 1901 is embedded in elastomeric insulator 1902 to provide electrical field control at the bottom of the reservoir 1909 and at the top hardware of an insulator 1910. The reservoir 1909 is in electrical contact with a high voltage conductor 1908 and the top hardware of the insulator 1910. Stress cone 1901A is embedded in elastomeric insulator 1902A to provide electrical field control near the midpoint of the high voltage current transducer's insulator housing 1910. Between the adjacent ends of stress cones 1901 and 1901A, conducting shield 1903 is applied over the outer diameter of an electrical insulating cylinder 1904 to confine the electrical field to the space between the shield 1903 and a grounding tube 1905. Copper braid 1913 connects the shield 1903 to the reservoir 1909 and thus, the arrangement is an insulated conductor 1908, with the outer shield 1903 and stress cones 1901 and 1901A at high voltage.

A current transducer 1907 is centered around the conductor 1908 that carries a current being measured. Signal lead wires 1914 extend from the current transducer 1907 and pass down the grounded tube 1905 and out to a terminal box 1912 where they can be connected to current measuring equipment. The current transducer 1907 is similar to the transducers describe earlier in FIGS. 1-5 and is smaller and lighter than traditional iron-core transformers. The small size and low weight greatly reduces the level of cantilever loading that the insulating housing 1910 must withstand.

In some applications, the reservoir 1909 and housing 1910 will contain a dielectric fluid 1911 such as silicon oil. When the dielectric fluid 1911 is silicon oil, an expansion chamber 1906 is provided to allow the dielectric fluid 1911 to expand. In a dry construction, the chamber 1906 would provide electrical clearance for the transducer 1907.

Figure 20:
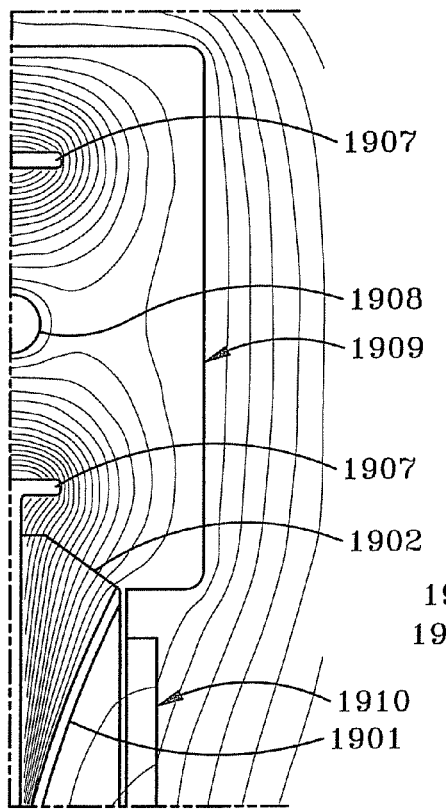
FIG. 20 illustrates a finite element electrostatic field plot of the area that includes the top stress cone, elastomeric insulator, transducer and reservoir of FIG. 19.
Figure 21:
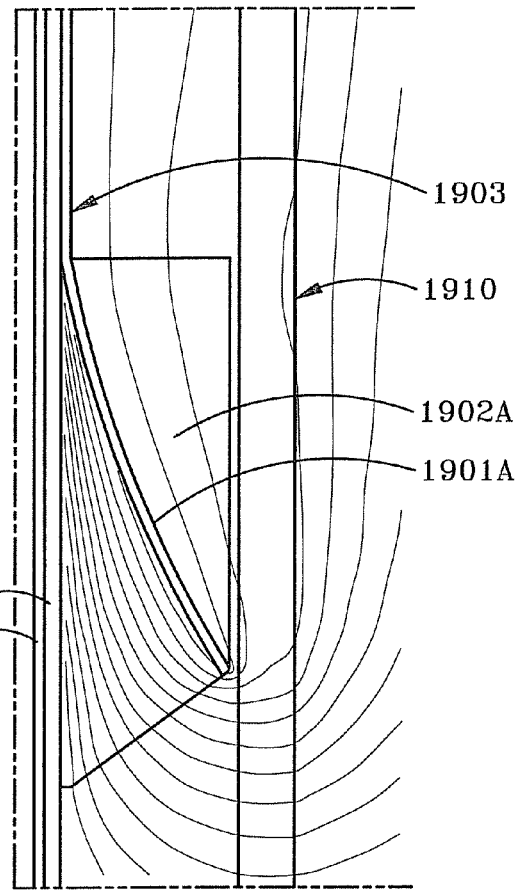
FIG. 21 illustrates a finite element electrostatic field plot of the area that includes the bottom stress cone, elastomeric insulator and shield of FIG. 19.
Figure 22:
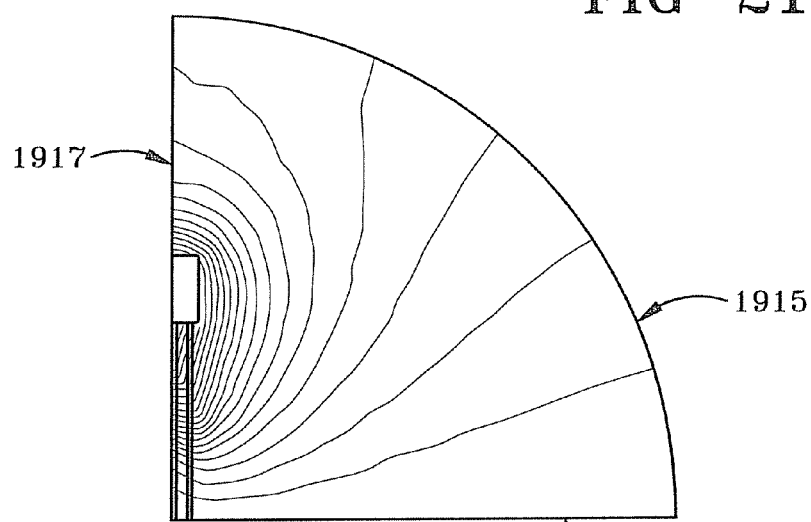
FIG. 22 illustrates an overall electrostatic field plot with an axis of symmetry boundary, a ground plane boundary and a far field boundary.

FIG. 20 illustrates a finite element electrostatic field plot of the area that includes stress cone 1901, elastomeric insulator 1902, shielded transducer 1907, conductor 1908 and reservoir 1909 of FIG. 19. FIG. 21 illustrates a finite electrostatic field plot of the area that includes stress cone 1901A, elastomeric insulator 1902A and shield 1903 of FIG. 19. FIG. 22 illustrates an overall electrostatic field plot with an axis of symmetry boundary 1917, a ground plane boundary 1916 and a far field boundary 1915. Finite element studies as shown in FIGS. 20-22 are useful design tools when large electrical voltage gradients associated with electromagnetic fields of gradients associated with the high voltage transducer assembly 1900 shown in FIG. 19 must be controlled.

In summary, the advantages of the present invention include, without limitation, the ability to make electrical current measurements with no connection to the work piece; the ability to make electrical current measurements without taking any energy from the work piece; the ability to make electrical current measurements over a wide range of frequencies; the ability to make current measures over a wide range of current magnitudes; the ability to make current measurements over a wide range of waveforms include direct current (DC); the ability to measure asymmetrical electrical currents without saturation; and the ability to provide high quality output voltage signals to equipment located very far from the point of measurement. In addition, this invention is simple to construct and it makes very efficient use of the magnetic properties of Fe—Ni or other high permeability magnetic material.

While the foregoing written description of the invention enables one of ordinary skill to make and use what is considered presently to be the best mode thereof, those of ordinary skill will understand and appreciate the existence of variations, combinations, and equivalents of the specific embodiment, method, and examples herein. The invention should therefore not be limited by the above described embodiment, method, and examples, but by all embodiments and methods within the scope and spirit of the invention.

Example methods may be better appreciated with reference to flow diagrams. While for purposes of simplicity of explanation, the illustrated methodologies are shown and described as a series of blocks, it is to be appreciated that the methodologies are not limited by the order of the blocks, as some blocks can occur in different orders and/or concurrently with other blocks from that shown and described. Moreover, less than all the illustrated blocks may be required to implement an example methodology. Blocks may be combined or separated into multiple components. Furthermore, additional and/or alternative methodologies can employ additional, not illustrated blocks.

Figure 23:
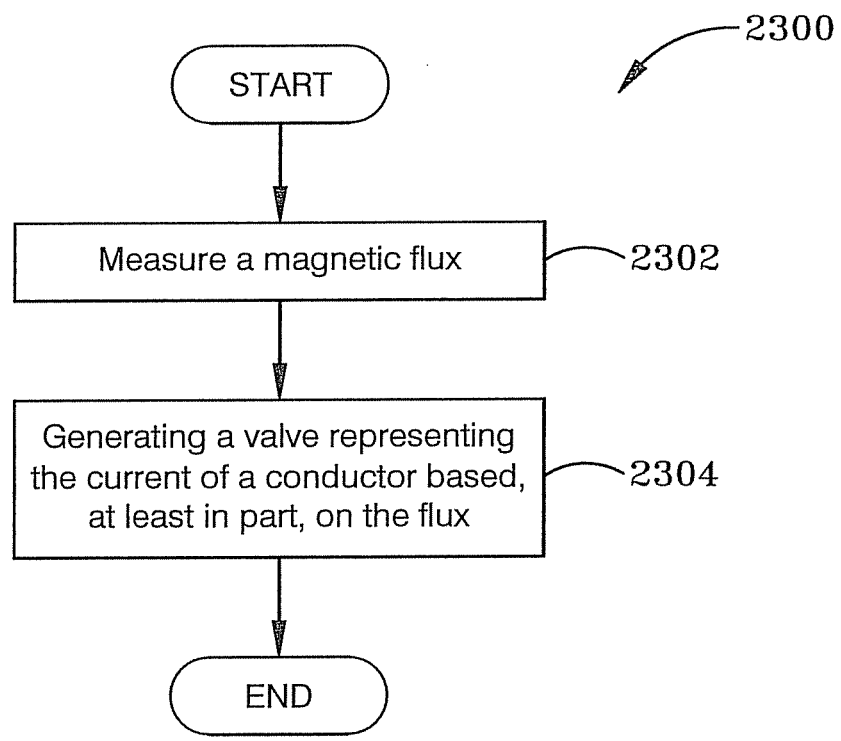
FIG. 23 illustrates an embodiment of the preferred embodiment as a method for measuring a current in a conductor.

FIG. 23 illustrates the preferred embodiment configured as a method 2300 of measuring the current of a conducting wire. The method 2300 begins by measuring a magnetic flux generated by the conducting wire to determine a magnetic flux value, at 2301. The magnetic flux is measured in a gap formed between two metal strips with high magnetic permeability. The two metal strips and gap form an arc that is concentric with the center line of the conducting wire and spaced away from the conducting wire.

The method 2300 generates a value representing the current of the conducting wire based, at least in part, on the magnetic flux value, at 2304. A circuit breaker may be opened when the value representing a current crosses a threshold value. Current values can be monitored so that a power company can accurate bill another power company for current and power supplied to the other company. One of ordinary skill in the art will realize that other actions can be taken based on magnetic flux values of the conducting wire.

In the foregoing description, certain terms have been used for brevity, clearness, and understanding. No unnecessary limitations are to be implied therefrom beyond the requirement of the prior art because such terms are used for descriptive purposes and are intended to be broadly construed. Therefore, the invention is not limited to the specific details, the representative embodiments, and illustrative examples shown and described. Thus, this application is intended to embrace alterations, modifications, and variations that fall within the scope of the appended claims.

Moreover, the description and illustration of the invention is an example and the invention is not limited to the exact details shown or described. References to "the preferred embodiment", "an embodiment", "one example", "an example", and so on, indicate that the embodiment(s) or example(s) so described may include a particular feature, structure, characteristic, property, element, or limitation, but that not every embodiment or example necessarily includes that particular feature, structure, characteristic, property, element or limitation. Furthermore, repeated use of the phrase "in the preferred embodiment" does not necessarily refer to the same embodiment, though it may.

What is claimed is:

1. A magnetic flux density measuring device for measuring a magnetic field strength generated by a current in a conductor comprising:
    a cylindrical ring that is generally concentric with the conductor;
    a pair of metal strips that are concentric with the conductor that have a high magnetic permeability and are supported by the ring, wherein the metal strips are located back-to-back and form a gap between the metal strips, wherein a pair of end surfaces of the metal strips lie in planes that contain the centerline of the conductor, and wherein the pair of metal strips are supported by the cylindrical ring; and
    a sensor located in the gap to measure the magnetic field strength in the gap.

2. The magnetic flux density measuring device of claim 1 wherein the pair of metal strips are formed with a Nickel-Iron (Ni—Fe) alloy.

3. The magnetic flux density measuring device of claim 1 wherein the pair of metal strips and gap form a generally concentric arc with the centerline of the conductor.

4. The magnetic flux density measuring device of claim 1 further comprising:
    an input fiber optic line to supply a signal to power the sensor; and
    an output fiber optic to output a signal associated with a magnetic field strength measured in the gap.

5. The magnetic flux density measuring device of claim 1 wherein the pair of metal strips are formed with a Nickel-Iron (Ni—Fe) alloy of about 80 percent Nickel and are annealed with about 16,000 gauss saturation induction and about 1.2 amperes per meter coercive force, and wherein the pair metal of strips have a relative magnetic permeability ($\mu_r$) of over 100,000.

6. The magnetic flux density measuring device of claim 1 wherein the pair of metal strips have a low magnetic retentivity and are made out of a material that reduces residual flux in the pair of metal strips.

7. A system for measuring a magnetic flux density generated by a current in a conductor, comprising:
    a first elongated strip having high magnetic permeability with a first end and a second end;
    a second elongated strip having high magnetic permeability with a first end and a second end;
    a support assembly for supporting the first elongated strip and the second elongated strip so that the first end of the first elongated strip and the second end of the second elongated strip form an air gap between the first end of the first elongated strip and the second end of the second elongated strip;
    a magnetic flux density sensor located in the air gap and positioned between the first end of the first elongated strip and the second end of end the second elongated strip, wherein the support supports the first elongated strip, the second elongated strip and the magnetic flux density sensor outward from the conductor in a plane that is perpendicular to a direction current flows in the conductor; wherein the first elongated strip, the second elongated strip and the magnetic flux density sensor form an arc that is concentric with the conductor, wherein the arc is less than 45 degrees, and wherein the magnetic flux density sensor is positioned to measure magnetic flux generated by the conductor that passes from the second end of the first elongated strip to the first end of the first elongated strip, through the air gap to the second end of the second elongated strip to first end of the second elongated strip.

8. The system of claim 7 wherein the first elongated strip and the second elongated strip are formed with a Nickel-Iron (Ni—Fe) alloy.

9. The system of claim 7 wherein the first elongated strip and the second elongated strip are of a sufficient length and magnetic retentivity to reduce residue flux and magnetic saturation of the first elongated magnetic strip and the second elongated magnetic strip.

10. The system of claim 7 wherein the first elongated strip and the second elongated strip are about 80 percent Nickel and are annealed with about 16,000 gauss saturation induction and about 1.2 amperes per meter coercive force.

11. The system of claim 7 wherein the first elongated strip and the second elongated strip have a relative magnetic permeability ($\mu_r$) of over 100,000.

12. The system of claim 7 wherein the first elongated strip and the second elongated strip are a curved rectangular shape about one inch long by about ½ inch wide that is about ¹⁄₁₆ inch thick.

13. The system of claim 7 wherein the air gap is formed with the first end of the first elongated strip located about ¹⁄₁₆ of an inch from the second end of the second elongated strip.

14. The system of claim 7 wherein the magnetic flux density sensor is a Hall-Effect device.

15. The system of claim 7 further comprising:
a grounded base;
a tube connected to the grounded base, wherein the support assembly is attached to the tube and where the support assembly, first elongated strip, second elongated strip, magnetic flux density sensor and tube are at ground potential.

16. The system of claim 15 further comprising:
a toroidally shaped shield covering the support assembly, wherein wires carry signals from the magnetic flux density sensor through the tube to a terminal box at the grounded base.

17. The system of claim 7 further comprising:
an insulated wire with two ends wrapped around the first elongated strip to obtain a voltage between the two ends that is output to an integrator for converting a signal captured by the magnetic flux density sensor to an analog measurement of the current of the conductor.

* * * * *